(12) United States Patent
Ko et al.

(10) Patent No.: US 10,997,952 B2
(45) Date of Patent: May 4, 2021

(54) DISPLAY PANEL AND DRIVING METHOD THEREFOR, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Young Yik Ko, Beijing (CN); Tingliang Liu, Beijing (CN); Xiangdan Dong, Beijing (CN); Jinsan Park, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/473,023

(22) PCT Filed: Nov. 12, 2018

(86) PCT No.: PCT/CN2018/115069
§ 371 (c)(1),
(2) Date: Jun. 24, 2019

(87) PCT Pub. No.: WO2019/096097
PCT Pub. Date: May 23, 2019

(65) Prior Publication Data
US 2020/0098341 A1 Mar. 26, 2020

(30) Foreign Application Priority Data
Nov. 14, 2017 (CN) .......................... 201711124514.8

(51) Int. Cl.
*G02F 1/1333* (2006.01)
*G06F 3/041* (2006.01)
(Continued)

(52) U.S. Cl.
CPC ............. *G09G 5/38* (2013.01); *G09G 3/3275* (2013.01); *H01L 27/3227* (2013.01);
(Continued)

(58) Field of Classification Search
CPC ......... G01J 1/4228; G01J 3/2803; G02F 1/13; G02F 1/133; G02F 1/1333;
(Continued)

(56) References Cited

U.S. PATENT DOCUMENTS

| 4,922,241 A * | 5/1990 | Inoue | G09G 3/3629 |
| | | | 345/97 |
| 6,567,147 B1 * | 5/2003 | Hirakata | G02F 1/133345 |
| | | | 349/153 |

(Continued)

*Primary Examiner* — Michael J Eurice

(57) ABSTRACT

A display panel and a driving method thereof, and a display device are disclosed. The display panel includes: a pixel region, including a first pixel region and a second pixel region located around the first pixel region, the first pixel region and the second pixel region each including a plurality of pixels; a photosensitive layer, located at least in the second pixel region; a cover plate, on a side of the pixel region for displaying, and the cover plate including a light transmission region and a light shielding layer surrounding the light transmission region. The light shielding layer coincides with at least a portion of the second pixel region in a direction perpendicular to the cover plate, and the photosensitive layer is configured to determine a position of the light transmission region.

19 Claims, 5 Drawing Sheets

(51) Int. Cl.
*G09G 5/38* (2006.01)
*G09G 3/3275* (2016.01)
*H01L 27/32* (2006.01)
*H01L 51/52* (2006.01)
*H01L 27/12* (2006.01)

(52) U.S. Cl.
CPC ...... *H01L 27/3272* (2013.01); *H01L 27/3276* (2013.01); *H01L 51/524* (2013.01); *G09G 2310/0243* (2013.01); *G09G 2360/144* (2013.01); *H01L 27/124* (2013.01)

(58) Field of Classification Search
CPC ......... G02F 1/133512; G02F 1/136209; G06F 3/0304; G06F 3/041; G06F 3/042; G06F 3/044; G09G 3/20; G09G 3/3275; G09G 5/38; G09G 2300/0413; G09G 2300/0426; G09G 2300/0465; G09G 2310/0243; G09G 2360/142; G09G 2360/144; H01L 27/124; H01L 27/1259; H01L 27/14623; H01L 27/1464; H01L 27/32; H01L 27/3223; H01L 27/3227; H01L 27/3272; H01L 27/3276; H01L 51/524

See application file for complete search history.

(56) References Cited

U.S. PATENT DOCUMENTS

| | | | |
|---|---|---|---|
| 2001/0046007 A1* | 11/2001 | Greene | G02F 1/13336 349/73 |
| 2005/0106768 A1* | 5/2005 | Onozuka | H01L 27/146 438/30 |
| 2006/0066545 A1* | 3/2006 | Kondoh | G09G 3/3629 345/87 |
| 2007/0097108 A1* | 5/2007 | Brewer | G06F 1/1615 345/204 |
| 2008/0286889 A1* | 11/2008 | Chang | G02F 1/133555 438/30 |
| 2010/0014012 A1* | 1/2010 | Irie | G02F 1/133707 349/39 |
| 2010/0164881 A1* | 7/2010 | Kuo | G06F 3/044 345/173 |
| 2011/0141060 A1* | 6/2011 | Kim | G06F 3/0412 345/175 |
| 2011/0169771 A1* | 7/2011 | Fujioka | G06F 3/0416 345/174 |
| 2013/0001626 A1* | 1/2013 | Yamazaki | H01L 27/3244 257/98 |
| 2013/0193832 A1* | 8/2013 | Jung | G02B 5/3083 313/112 |
| 2014/0317906 A1* | 10/2014 | Lo | G02B 5/003 29/527.2 |
| 2015/0076496 A1* | 3/2015 | Tanaka | H01L 21/02565 257/43 |
| 2015/0179747 A1* | 6/2015 | Ito | H01L 29/41733 257/43 |
| 2015/0301375 A1* | 10/2015 | Lee | G02F 1/133345 349/42 |
| 2015/0316814 A1* | 11/2015 | Nishiki | H01L 27/1225 349/42 |
| 2016/0013254 A1* | 1/2016 | Ishii | H01L 51/525 257/88 |
| 2016/0128143 A1* | 5/2016 | Kazikawa | H05B 45/50 362/97.2 |
| 2017/0041564 A1* | 2/2017 | Konstantatos | H01L 27/307 |
| 2017/0053973 A1* | 2/2017 | Park | H01L 27/3246 |
| 2017/0163778 A1* | 6/2017 | Noma | H04M 1/03 |
| 2018/0151595 A1* | 5/2018 | Saitoh | H01L 27/1225 |
| 2018/0374909 A1* | 12/2018 | Nishikiori | H01L 27/3223 |
| 2019/0095005 A1* | 3/2019 | Lee | G06F 3/044 |

* cited by examiner

DISPLAY PANEL AND DRIVING METHOD THEREFOR, AND DISPLAY DEVICE

The present application claims priority of Chinese Patent Application No. 201711124514.8, filed on Nov. 14, 2017, the disclosure of which is incorporated herein by reference in its entirety as part of the present application.

TECHNICAL FIELD

At least one embodiment of the present disclosure relates to a display panel and a driving method thereof, and a display device.

BACKGROUND

In products such as existing liquid crystal display devices (LCD) and active-matrix organic light emitting diode (AMOLED) display devices, a screen of a product is getting larger and larger, the screen visibility ratio is getting higher and higher. Therefore, many manufacturers have higher and higher requirements for the narrow frame structure.

SUMMARY

At least one embodiment of the present disclosure provides a display panel and a driving method thereof, and a display device. The display panel comprises: a pixel region, comprising a first pixel region and a second pixel region located around the first pixel region, the first pixel region and the second pixel region each comprising a plurality of pixels; a photosensitive layer, located at least in the second pixel region; a cover plate on a side of the pixel region for displaying, and the cover plate comprising a light transmission region and a light shielding layer surrounding the light transmission region. The light shielding layer coincides with at least a portion of the second pixel region in a direction perpendicular to the cover plate, and the photosensitive layer is configured to determine a position of the light transmission region.

In some examples, the display panel further comprises: a drive circuit, electrically connected to the photosensitive layer. A portion of the photosensitive layer that is not blocked by the light shielding layer generates an electrical signal after being irradiated by ambient light outside the display panel, a portion of the photosensitive layer that is blocked by the light shielding layer does not generate the electrical signal, and the drive circuit is configured to determine the position of the light transmission region according to a case of generating the electrical signal.

In some examples, the second pixel region is a region surrounding the first pixel region.

In some examples, the photosensitive layer is located only in the second pixel region, and the photosensitive layer is disposed in each pixel in the second pixel region.

In some examples, a part of the pixels in the first pixel region close to the second pixel region and each pixel in the second pixel region are both provided with the photosensitive layer.

In some examples, each pixel in the pixel region is provided with the photosensitive layer.

In some examples, a minimum distance between a side of the second pixel region away from the first pixel region and a side of the second pixel region close to the first pixel region is not less than a process attaching deviation threshold, and a range of a value of the process attaching deviation threshold is 100-600 μm.

In some examples, in the direction perpendicular to the cover plate, a region, where the pixels for displaying are located, in the pixel region completely coincides with the light transmission region.

In some examples, an orthographic projection of the first pixel region on the cover plate completely coincides with the light transmission region.

In some examples, in the direction perpendicular to the cover plate, the light shielding layer overlaps with the pixels in the first pixel region.

In some examples, the drive circuit comprises data lines connected to the pixels, and the drive circuit is further configured to input image display signals only to the data lines connected to the pixels for displaying.

In some examples, each of the plurality of pixels comprises an effective display region and a peripheral region located around the effective display region, and the photosensitive layer is located in the peripheral region of each of the plurality of pixels.

In some examples, the photosensitive layer comprises a transparent material.

In some examples, the photosensitive layer comprises a plurality of photosensitive sub-layers, and one of the plurality of photosensitive sub-layers is disposed in one of the plurality of pixels.

In some examples, the photosensitive layer comprises a plurality of strip photosensitive sub-layers, and each of the plurality of strip photosensitive sub-layers corresponds to a row of the pixels extending along a first direction or a second direction, the first direction intersects the second direction, the light transmission region has a shape of a parallelogram, and the first direction and the second direction are respectively parallel to two adjacent sides of the light transmission region.

In some examples, a material of the photosensitive layer comprises a photoelectric conversion material.

Another embodiment of the present disclosure provides a display device, comprising the above mentioned display panel.

Another embodiment of the present disclosure provides a driving method of the display panel, comprising: a portion of the photosensitive layer that is not blocked by the light shielding layer generating an electrical signal after being irradiated by ambient light outside the display panel, a portion of the photosensitive layer that is blocked by the light shielding layer not generating the electrical signal; determining the position of the light transmission region according to a case of generating the electrical signal; and inputting image display signals to the pixels located in the light transmission region.

In some examples, the display panel comprises a drive circuit, the drive circuit is electrically connected to the photosensitive layer, and the drive circuit is configured to determine the position of the light transmission region according to the electrical signal.

In some examples, the drive circuit comprises data lines connected to the plurality of pixels, and the drive circuit is further configured to input the image display signals only to the data lines connected to the plurality of pixels located in the light transmission region.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "On," "under," and the like are only used to indicate relative position relationship, and when the position of the object which is described is changed, the relative position relationship may be changed accordingly.

Figure 1:
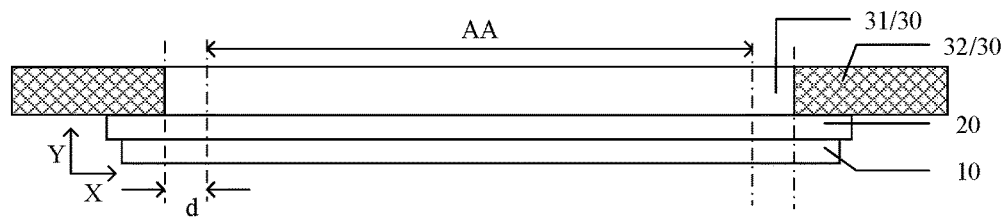
FIG. 1 is a partial cross-sectional schematic diagram of a display panel.

FIG. 1 is a partial cross-sectional schematic diagram of a display panel. A display panel shown in FIG. 1 comprises a display substrate 10, a cover plate 30, and an optical clear adhesive (OCA) used for adhering the cover plate 30 to the display substrate 10. The cover plate 30 comprises a light transmission region 31 and a black frame 32. In an attaching process of the display panel, in order to prevent the black frame 32 from covering an AA display area of the display substrate 10, in a direction parallel to a main plane of the cover plate 30 (for example, along a X direction shown in FIG. 1), a distance between the black frame 32 included in the cover plate 30 and an edge of the AA display area of the display substrate 10 is a process attaching deviation threshold d. The process attaching deviation threshold d is the deviation caused by the attaching process, the process attaching deviation threshold d between the black frame and the edge of the AA display area of the display substrate in a general display panel is 100-600 μm. It can be seen that the above-mentioned attaching process results in a size of a display device product being larger than a size of the AA display area, and therefore the display device has a relatively wide frame.

Embodiments of the present disclosure provide a display panel and a driving method thereof, and a display device. The display panel comprises: a pixel region including a first pixel region and a second pixel region located around the first pixel region, the first pixel region and the second pixel region each including a plurality of pixels; a photosensitive layer, located at least in the second pixel region; a cover plate on a side for displaying of the pixel region, and the cover plate including a light transmission region and a light shielding layer surrounding the light transmission region. The light shielding layer coincides with at least a portion of the second pixel region in a direction perpendicular to the cover plate, and the photosensitive layer is configured to determine a position of the light transmission region. At least one embodiment of the present disclosure can reduce the deviation caused by the attaching process through providing the photosensitive layer in the pixel region included in the display panel, thereby effectively reducing a size of a frame of the display device, achieving the purpose of narrow frame, and further improving the user experience of the product.

The display panel, the driving method thereof and the display device provided by the embodiments of the present disclosure are described below with reference to the accompanying drawings.

Figure 2A:
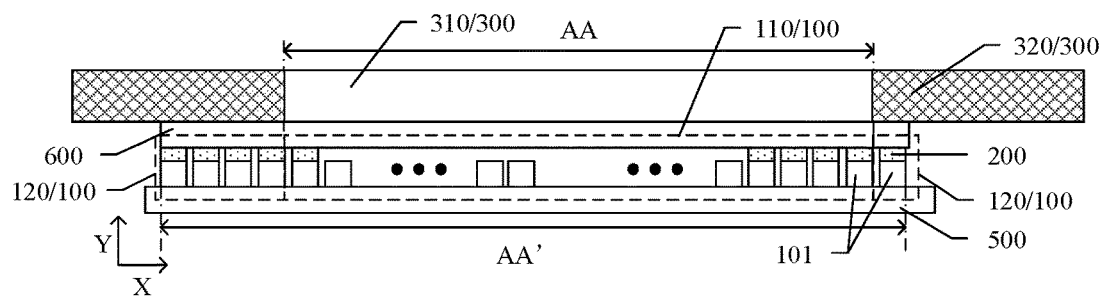
FIG. 2A is a partial cross-sectional schematic diagram of a display panel according to an embodiment of the present disclosure.
Figure 2B:
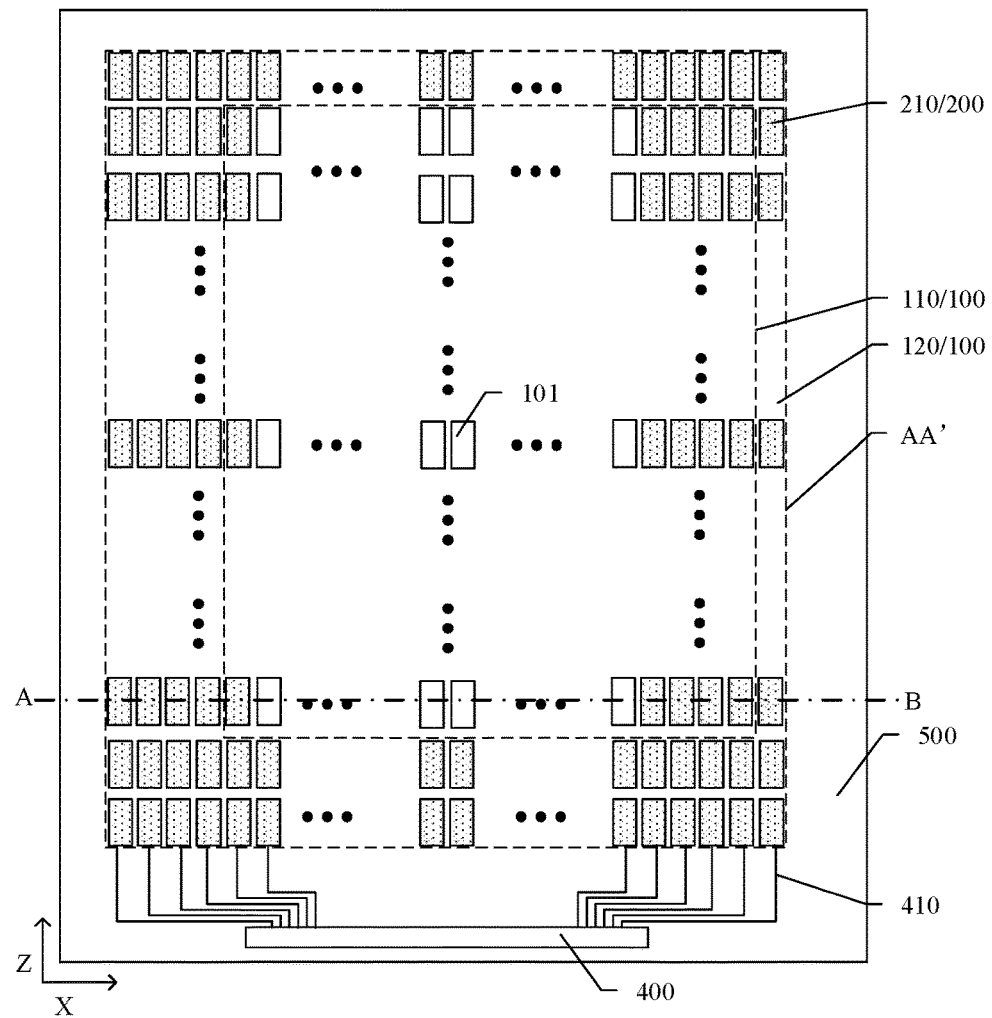
FIG. 2B is a partial plane structure schematic diagram of the display panel shown in FIG. 2A.

An embodiment of the present disclosure provides a display panel, FIG. 2A is a partial cross-sectional schematic diagram of a display panel according to an embodiment of the present disclosure, and FIG. 2B is a partial plane structure schematic diagram of the display panel shown in FIG. 2A. As shown in FIG. 2A and FIG. 2B, the display panel provided by the embodiment of the present disclosure comprises a pixel region 100, that is an AA' region shown in FIG. 2A and FIG. 2B. The pixel region 100 comprises a plurality of pixels 101 arranged in an array, that is, the pixel region 100 comprises the plurality of pixels 101 arranged in an X direction and a Z direction. For example, the pixels 101 are disposed on a base substrate 500. The pixel region 100 comprises a first pixel region 110 and a second pixel region 120 located around the first pixel region 110. The display panel further comprises a photosensitive layer 200 located at least in the second pixel region 120. In an example of the embodiment, the photosensitive layer 200 is located in the second pixel region 120 and a portion of the first pixel region 110. For example, the photosensitive layer 200 may be located only on the pixels 101 in the pixel region 100, or may also be located on the pixels 101 and gaps between adjacent pixels 101 in the pixel region 100, the embodiment does not particularly limit this.

As shown in FIG. 2A and FIG. 2B, the display panel further comprises a cover plate 300 located on a side of the pixel region 100 for displaying, that is, the cover plate 300 is located on a light exit side of the pixel region 100. The cover plate 300 comprises a light transmission region 310 and a light shielding layer 320 surrounding the light transmission region 310. In an example of the embodiment, in a direction perpendicular to the cover plate 300, that is, in a Y direction, the light shielding layer 320 overlaps with the second pixel region 120, and the light shielding layer 320 does not overlap with the first pixel region 110. That is, an orthographic projection of the second pixel region 120 on the cover plate 300 completely falls into the light shielding layer 320, and an orthographic projection of the first pixel region 110 on the cover plate 300 completely coincides with the light transmission region 310.

It should be noted that, a cross-section diagram of the pixel region in FIG. 2A is a diagram taken along a line AB in FIG. 2B, in order to clearly show a plane view of the pixel region, the cover plate and other structures are omitted in FIG. 2B.

In some examples, as shown in FIG. 2A and FIG. 2B, the second pixel region 120 is a region surrounding the first pixel region 110, that is, the first pixel region 110 is a region located in the middle of the pixel region 100, and the second pixel region 120 is a region surrounding the first pixel region 110, and the embodiment comprises but is not limited thereto.

For example, FIG. 2A and FIG. 2B take a case that the numbers of pixels 101 included in the second pixel region 120 located on both sides of the first pixel region 110 in the X direction are different as an example, at least one side comprises at least one row of pixels arranged in the Z direction, and the present disclosure is not limited thereto. For example, the numbers of pixels 101 included in the second pixel region 120 located on both sides of the first pixel region 110 may also be the same.

For example, the second pixel region 120 may also be a region located only on one of the two sides of the first pixel region 110 in the X direction, or the second pixel region 120 may be a region located on only one of two sides of the first pixel region 110 in the Z direction, which is not limited in this embodiment.

In some examples, a minimum distance between a side of the second pixel region 120 away from the first pixel region 110 and a side of the second pixel region 120 close to the first pixel region 110 is not less than 100-600 μm. For example, as shown in FIG. 2A and FIG. 2B, in the X direction or in the Z direction, the minimum distance between the side of the second pixel region 120 away from the first pixel region 220 and the side of the second pixel region 120 close to the first pixel region 110 is not less than a process attaching deviation threshold d, and a range of a value of the process attaching deviation threshold d is 100-600 μm.

In some examples, as shown in FIG. 2A, the photosensitive layer 200 is disposed in each of a part of the pixels in the first pixel region 110 adjacent to the second pixel region 120 and each pixel in the second pixel region 120, and the photosensitive layer 200 is located on the side of the pixels 101 close to the cover plate 300, that is, the photosensitive layer 200 may be located between the pixels 101 and the cover plate 300. In this case, the photosensitive layer 200 not covered by the light shielding layer 320 (namely located in the light transmission region 310) may be irradiated by ambient light outside the display panel, and generates optical feedback to the ambient light, that is, the photosensitive layer 200 generates an electrical signal, however the photosensitive layer 200 covered by the light shielding layer 320 is not irradiated by the ambient light and does not generate optical feedback.

For example, the display panel further comprises an optical clear adhesive 600 (OCA) used for adhering the cover plate 300 to the display substrate.

Figure 2C:
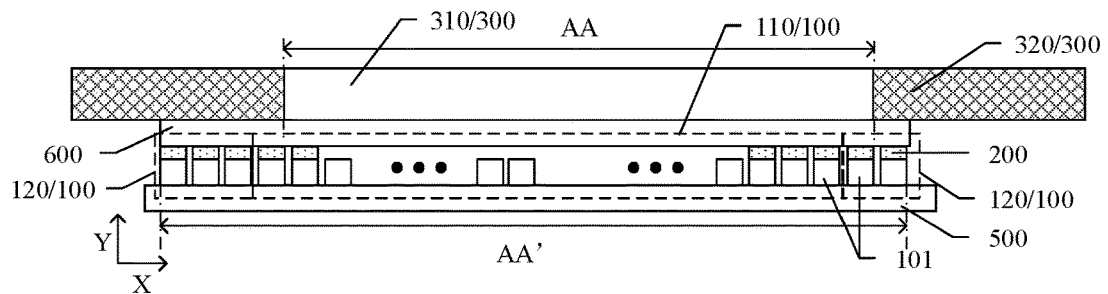
FIG. 2C is a partial cross-sectional schematic diagram of a display panel according to another example of an embodiment of the present disclosure.

For example, FIG. 2C is a partial cross-sectional schematic diagram of a display panel provided by another example of the present embodiment. As shown in FIG. 2C, the difference from the example shown in FIG. 2A is that: in this example, in the direction perpendicular to the cover plate 300, the light shielding layer 320 overlaps with the pixels 101 in the first pixel region 110. That is, part of the pixels 101 in the second pixel region 120 are not blocked by the light shielding layer 320, and part of the pixels 101 in the first pixel region 110 are blocked by the light shielding layer 320.

Figure 2D:
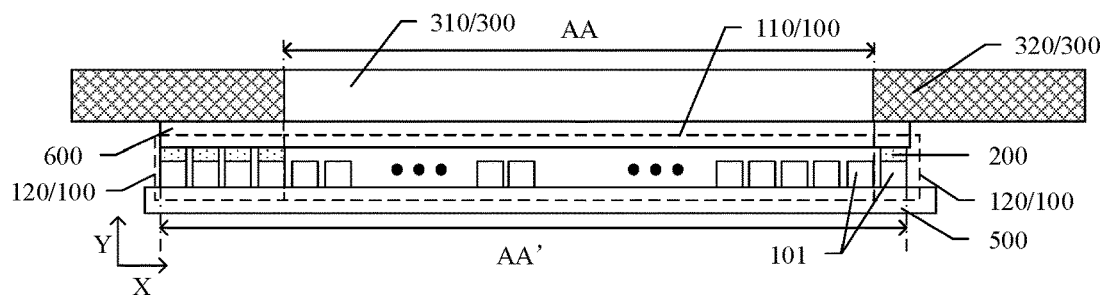
FIG. 2D is a partial cross-sectional schematic diagram of a display panel according to still another example of an embodiment of the present disclosure.

For example, FIG. 2D is a partial cross-sectional schematic diagram of a display panel provided by still another example of the present embodiment. As shown in FIG. 2D, the difference from the example shown in FIG. 2A is that: in this example, the photosensitive layer 200 is only located in the second pixel region 120, and the photosensitive layer 200 is disposed in each pixel 101 in the second pixel region 120. In this case, the position of the light transmission region can be determined based on the case where the photosensitive layer generates the electrical signal.

Figure 2E:
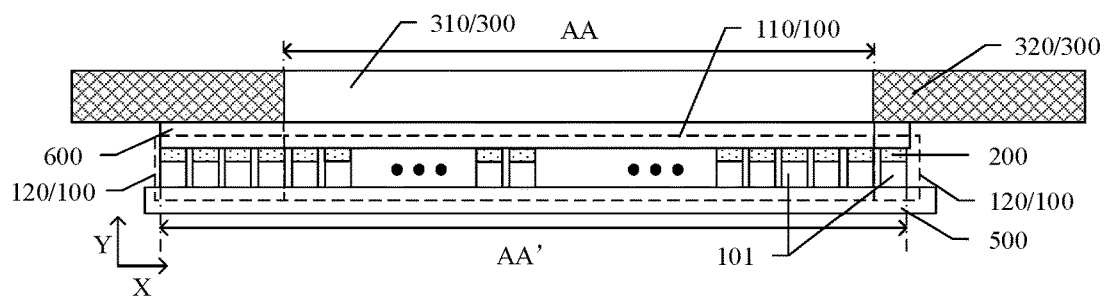
FIG. 2E is a partial cross-sectional schematic diagram of a display panel according to yet another example of an embodiment of the present disclosure.

For example, FIG. 2E is a partial cross-sectional schematic diagram of a display panel provided by yet another example of the present embodiment. As shown in FIG. 2E, the difference from the example shown in FIG. 2A is that: in this example, the photosensitive layer 200 is disposed in each pixel 101 in the pixel region 100. In this case, the position of the light transmission region can be determined based on the case where the photosensitive layer generates the electrical signal.

In some examples, as shown in FIG. 2A and FIG. 2B, the display panel further comprises a drive circuit 400 electrically connected to the photosensitive layer 200, a portion of the photosensitive layer 200 that is not blocked by the light shielding layer 320 generates an electrical signal after being irradiated by ambient light outside the display panel, a portion of the photosensitive layer 200 that is blocked by the light shielding layer 320 is not irradiated by ambient light outside the display panel and does not generate the electrical signal, and the drive circuit 400 is configured to determine the position of the light transmission region 310 according to a case of generating the electrical signal. That is, the drive circuit 400 can determine the position of the light transmission region 310 according to the position of the photosensitive layer 200 that generates the electrical signal.

For example, in the examples shown in FIG. 2A, FIG. 2C and FIG. 2E, a portion of the photosensitive layer 200 is covered by the light shielding layer 320, and the other portion of the photosensitive layer 200 that is not covered is irradiated by the ambient light outside the display panel and generates optical feedback to the ambient light, that is, the photosensitive layer 200 generates the electrical signal. In the example shown in FIG. 2D, the photosensitive layer 200 is entirely covered by the light shielding layer 320, and in this case, the photosensitive layer 200 is not irradiated by the ambient light outside the display panel, and thus no electrical signal is generated. Therefore, the position of the light transmission region can be determined based on the case where the photosensitive layer generates the electrical signal.

In some examples, a material of the photosensitive layer 200 comprises a photoelectric conversion material. For example, the material of the photosensitive layer 200 may comprise other photosensitive materials that are sensitive to light or that have different feedback under illumination, such as photoconductive materials, photovoltaic cells, or the like.

For example, in a dark environment, the semiconductor material included in the photosensitive layer has a high resistance value, when the photosensitive layer is irradiated by light, as long as the photon energy is greater than the band gap of the semiconductor material, electrons in a valence band can transition to a conduction band after absorbing the energy of one photon, and a positively charged hole is generated in the valence band, electron-hole pairs generated by illumination increase the number of carriers in the semiconductor material, making the resistivity of the semiconductor material smaller, thereby resulting in a decrease in the resistance value of the semiconductor material.

Figure 3:
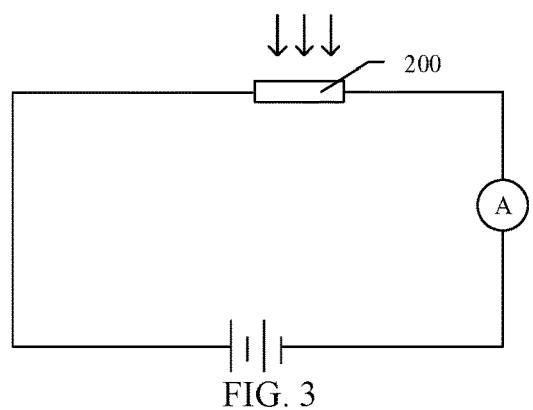
FIG. 3 is a schematic diagram showing a working principle of a photosensitive layer according to an embodiment of the present disclosure.

For example, FIG. 3 is a schematic diagram showing a working principle of a photosensitive layer according to an embodiment of the present disclosure, and arrows shown in FIG. 3 indicate light irradiation. Under light irradiation, the semiconductor material of the photosensitive layer 200 absorbs photon energy to generate carriers (electrons and holes), orientation movement of the carriers under the influence of a built-in electric field or an external electric field forms a current, that is, the orientation movement of the carriers forms a photocurrent. The drive circuit in this embodiment provides the external electric field to the photosensitive layer, and simultaneously detects the magnitude of the current in a loop in which the photosensitive layer is located to determine whether the photosensitive layer is irradiated by the ambient light outside the display panel or not. In a case where the photosensitive layer is irradiated by the ambient light outside the display panel, the photosensitive layer generates a photo-generated current, and an ammeter in the loop where the photosensitive layer is located shows that the current has increased. Therefore, the drive circuit can determine the position of the light transmission region according to the electrical signal generated by the photosensitive layer after being irradiated by the ambient light outside the display panel.

For example, the drive circuit in an example of the embodiment of the present disclosure may be configured only to determine the position of the photosensitive layer irradiated by the ambient light outside the display panel according to the electrical signal generated by the photosensitive layer to obtain the position of the light transmission region of the cover plate, the embodiment comprises but is not limited thereto.

The photosensitive layer is disposed in the pixel region in the embodiment of the present disclosure, the photosensitive layer is electrically connected to the drive circuit, and the drive circuit can determine the position of the light transmission region in the cover plate according to the electrical signal generated by the photosensitive layer after the photosensitive layer is irradiated by the ambient light outside the display panel. In addition, in at least one direction of the X direction and the Z direction, a size of the region where the photosensitive layer is disposed is not less than a general process attaching deviation threshold d (the value range is 100-600 μm). Therefore, the embodiment of the present disclosure can ensure that the light shielding layer does not block the display region for displaying on the display substrate during the process of attaching the cover plate to the display substrate without the attaching deviation of the general attaching process.

In some examples, as shown in FIGS. 2A-2E, the pixels 101 in the pixel region 100 that are blocked by the light shielding layer 320 are not used for displaying, and the pixels 101 in the pixel region 100 that are not blocked by the light shielding layer 320 are configured to display an image, that is, in the direction perpendicular to the cover plate 300, the pixels 101 covered by the light transmission region 310 is configured to display an image.

For example, as shown in FIGS. 2A-2E, in the direction perpendicular to the cover plate 300, a region, where a plurality of pixels for displaying are located, in the pixel region 100 completely coincides with the light transmission region 310, that is, a target display region (the AA region shown in FIG. 2A), which has the same size as a display region (the AA region shown in FIG. 1) in a general display substrate, in the embodiment of the present disclosure completely coincides with the light transmission region 310 of the cover plate 300. Therefore, with respect to the display panel shown in FIG. 1, the size of the light transmission region included in the cover plate in the display panel provided by the embodiment of the present disclosure no longer comprises a size of the process attaching deviation, and is reduced to the same size as the target display region, so that a size of the black frame located at the periphery of the target display region when the display panel is displayed can be effectively reduced, that is, the effect of the narrow frame is achieved.

Figure 4:
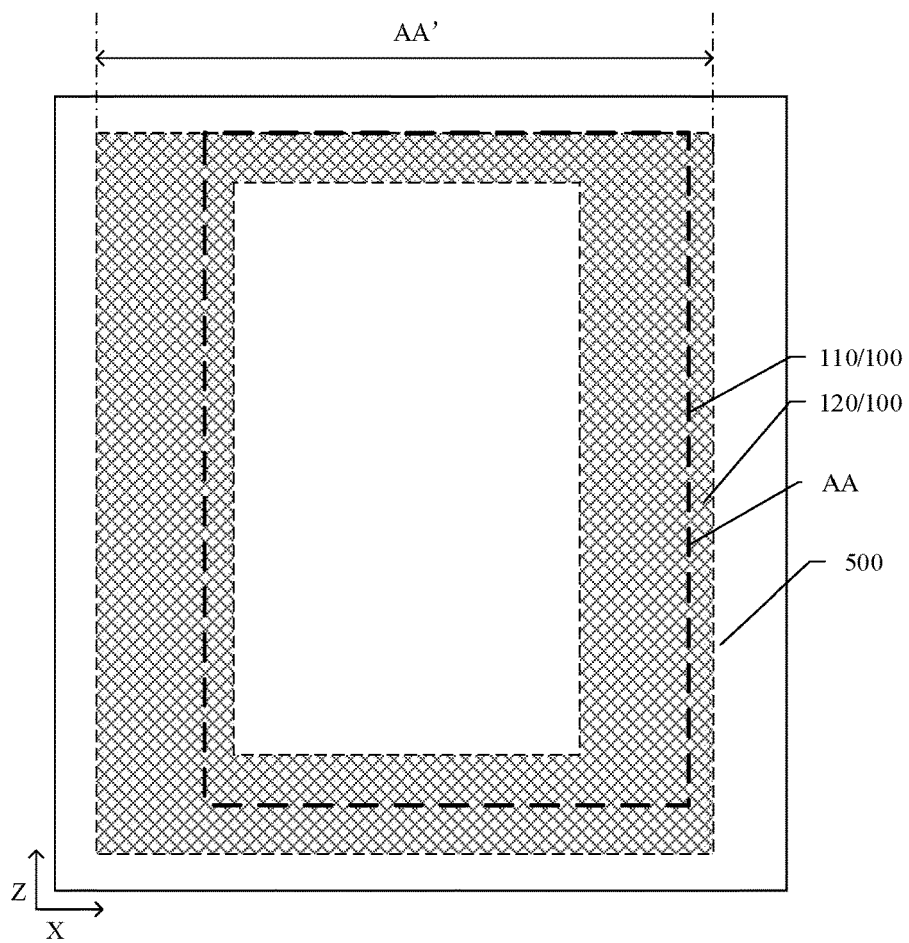
FIG. 4 is a plane schematic diagram of respective regions included in the display panel shown in FIG. 2A.

FIG. 4 is a plane schematic diagram of respective regions included in the display panel shown in FIG. 2A. For example, as shown in FIG. 2A and FIG. 4, the AA region (the first pixel region 110) in the display panel is the target display region for displaying that is the same size as the AA display region in the display panel shown in FIG. 1, and the second pixel region 120 located at the periphery of the AA region and the AA region together constitute the pixel region 100 (namely the AA' region).

For example, as shown in FIG. 2A and FIG. 4, in the embodiment, a plurality of pixels 101, that is, a plurality of rows and/or columns of pixels 101, are added outside the target display region to form the pixel region 100 (AA' region) having a size larger than the target display region (first pixel region 110). In addition, the photosensitive layer 200 is disposed in the edge of the target display region and the pixel region 100 outside the target display region. Therefore, in the process of the attaching and aligning of the cover plate, the light transmission region of the cover plate can be accurately positioned by the photosensitive layer. In the embodiment, the size of the light transmission region of the cover plate can be formed to be the same as the size of the target display region, that is, the light transmission region of the cover plate can completely coincide with the target display region without the redundant attaching process deviation. The embodiment is not limited thereto, the size of the light transmission region may also be slightly larger than the size of the target display region (AA region) for displaying.

In some examples, the drive circuit may also be configured to input display signals to the display substrate. For example, as shown in FIG. 2B, the drive circuit 400 comprises data lines 410 (that is, connection lines 410) connected to the plurality of pixels 101, therefore, the drive circuit 400 is further configured to input image display signals only to the data lines 410 connected to the pixels 101 for displaying after determining the position of the light transmission region (that is, the position of the target display region that should be used for displaying), that is, the drive circuit 400 is further configured to input display signals to the pixels 101 located in the first row to N-th row and in the first column to M-th column in the target display region, and no longer to input the display signals for the pixels 101 located at other positions.

The connection relationship between the data lines and the pixels in FIG. 2B is only a schematic electrical connection relationship, and the drive circuit can be electrically connected to each pixel through the data lines, respectively. In addition, the connection lines 410 between the drive circuit 400 and the pixel region 100 in the figure can also be schematically represented as an electrical connection relationship between the drive circuit 400 and the photosensitive layer 200, which is not particularly limited in this embodiment.

As can be seen from the above descriptions, the target display region (that is, the light transmission region of the cover plate) may be located at any position in the pixel region in FIG. 4, as long as the drive circuit determines the position of the light transmission region of the cover plate by the electrical signal of the photosensitive layer after the attaching of the cover plate and the display substrate is completed, the display signals can be input to the pixels located at the position of the light transmission region to achieve the display of the target display region. By this method, the process deviation in the attaching process can be effectively reduced, and the effect of narrow frame can be achieved.

In a case where the drive circuit in the embodiment of the present disclosure is configured only to determine the position of the light transmission region according to the electrical signal generated by the photosensitive layer, the embodiment of the present disclosure can achieve the effect of narrow frame by adding some pixels, photosensitive layers, and drive circuits electrically connected to the photosensitive layers on the basis of the original display panel and the original circuit.

In some examples, as shown in FIG. 2A and FIG. 2B, the photosensitive layer 200 comprises a plurality of photosensitive sub-layers 210, and the plurality of photosensitive sub-layers 210 are in one-to-one correspondence with the pixels 101 in the pixel region 100, that is, one photosensitive sub-layer 210 is disposed in one pixel 101.

For example, the light transmission region 310 is a parallelogram light transmission region or an irregular (such as, circular, polygonal, etc.) light transmission region, each of the photosensitive sub-layers 210 is electrically connected to the drive circuit 400, so that the drive circuit 400 determines the position and the shape of the light transmission region 310 according to whether each of the photosensitive sub-layers 210 generates the electrical signal or not, and then inputs the display signals to the pixels 101 located in the light transmission region 310 to achieve the display of the target display region having a shape such as a rectangle, an irregular shape, or the like.

Figure 5A:
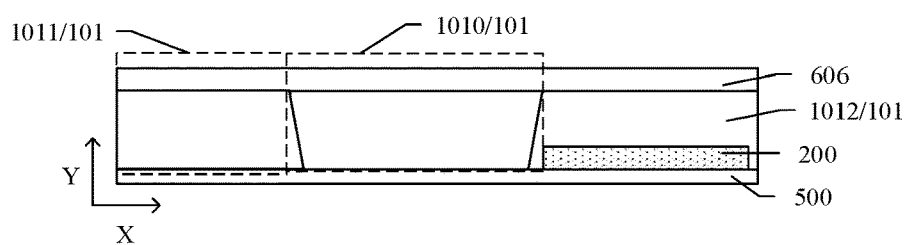
FIG. 5A is a partial cross-sectional structure schematic diagram of a pixel according to an example of an embodiment of the present disclosure.

For example, FIG. 5A is a partial cross-sectional structure schematic diagram of a pixel according to an example of the present embodiment. FIG. 5A shows an example that the pixels have an organic light emitting diode pixel structure, and the embodiment comprises but is not limited thereto.

In some examples, as shown in FIG. 5A, each pixel 101 comprises an effective display region 1010 and a peripheral region 1011 located around the effective display region 1010. For example, the peripheral region 1011 included in the pixel 101 is a region where the pixel definition layer 1012 is located, and the effective display region 1010 is an opening region defined by the pixel definition layer 1012. The photosensitive layer 200 is located in the peripheral region 1011 of the pixel 101, for example, the photosensitive layer 200 is located on a side of the pixel definition layer 1012 facing the base substrate 500, that is, the pixel definition layer 1012 covers the photosensitive layer 200. The photosensitive layer 200 is located in the peripheral region 1011, which can prevent the photosensitive layer 200 from affecting the light-emitting display of the pixel 101 due to blocking the effective display region 1010 of the pixel 101. The embodiment is not limited thereto, for example, the photosensitive layer may also be located in the effective display region of the pixel, however in a case where the photosensitive layer is located in the effective display region, the photosensitive layer needs to be made of a transparent material to prevent from blocking the image displayed in the effective display region.

Figure 5B:
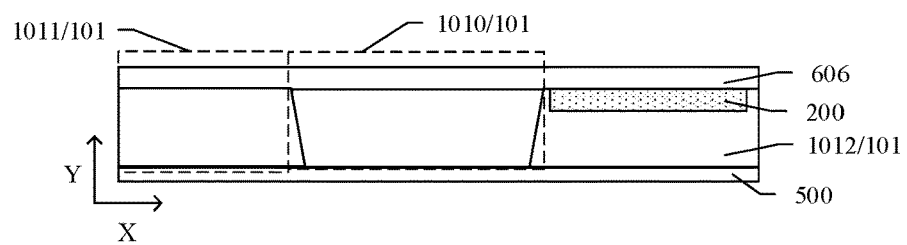
FIG. 5B is a partial cross-sectional structure schematic diagram of a pixel according to another example of an embodiment of the present disclosure.

For example, FIG. 5B is a partial cross-sectional structure schematic diagram of a pixel according to another example of the present embodiment. As shown in FIG. 5B, the difference from the example shown in FIG. 5A is that, in this example, the photosensitive layer 200 is located on a side of the pixel definition layer 1012 facing a thin film encapsulation layer 606. For example, a groove is formed on the side of the pixel definition layer 1012 facing the thin film encapsulation layer 606, and the photosensitive layer 200 is disposed in the groove to prevent from increasing the thickness of the pixel.

Figure 5C:
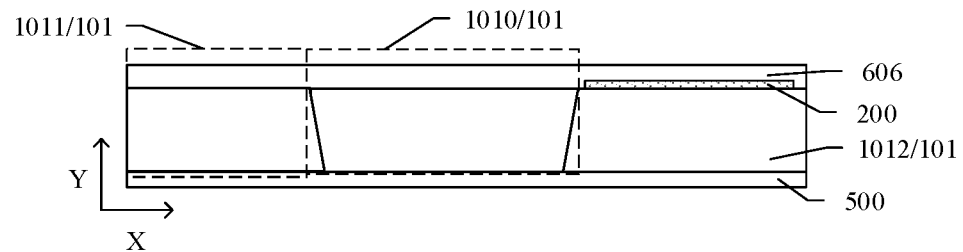
FIG. 5C is a partial cross-sectional structure schematic diagram of a pixel according to still another example of an embodiment of the present disclosure.

For example, FIG. 5C is a partial cross-sectional structure schematic diagram of a pixel according to still another example of the present embodiment. As shown in FIG. 5C, the difference from the example shown in FIG. 5A is that, in this example, the photosensitive layer 200 is located on the side of the pixel definition layer 1012 facing the thin film encapsulation layer 606. For example, the photosensitive layer 200 is located on a flat surface of the pixel definition layer 1012, and the thin film encapsulation layer 606 covers the photosensitive layer 200, which corresponds to a case that the photosensitive layer 200 is located within the thin film encapsulation layer 606.

Figure 6:
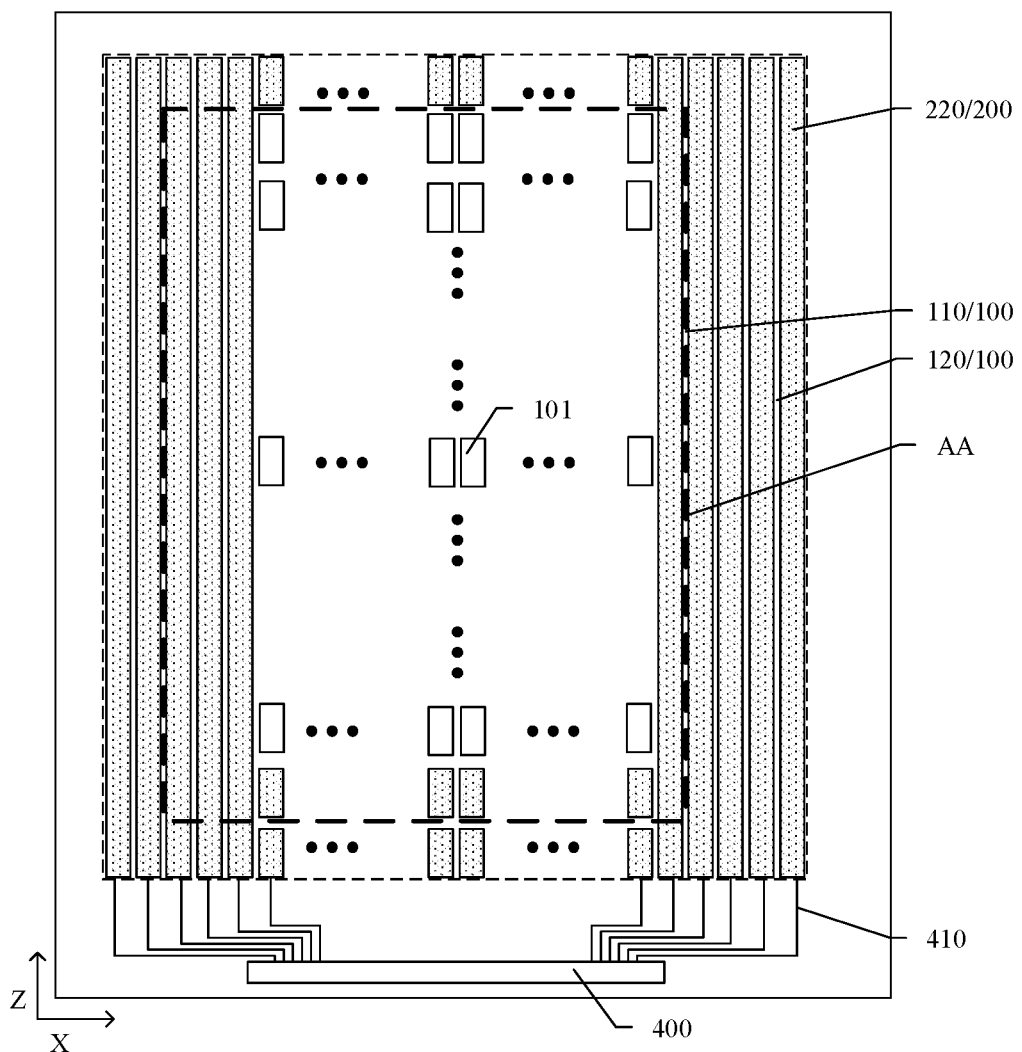
FIG. 6 is a partial plane structure schematic diagram of a display panel according to another example of an embodiment of the present disclosure.

In some examples, FIG. 6 is a partial plane structure schematic diagram of a display panel according to another example of an embodiment of the present disclosure. As shown in FIG. 6, the photosensitive layer 200 comprises a plurality of strip photosensitive sub-layers 220, and each of the strip photosensitive sub-layers 220 corresponds to a row of the pixels extending along a first direction or a second direction. The first direction in this example refers to the X direction in FIG. 6, the second direction refers to the Z direction in FIG. 6, and the first direction intersects the second direction. Moreover, the light transmission region included in the cover plate in the present example has a shape of a parallelogram (for example, a rectangle), and the first direction and the second direction are respectively parallel to two adjacent sides of the light transmission region, that is, each strip photosensitive sub-layer 220 extends in a direction in which one side of the light transmission region extends. Each strip photosensitive sub-layer 220 in this example is electrically connected to the drive circuit, and the drive circuit can determine the position of the light transmission region according to whether the strip photosensitive sub-layer generates an electrical signal or not, and further input the image display signals to the pixels located in the light transmission region to obtain a target display region.

FIG. 6 schematically shows that the photosensitive layer 200 comprises the plurality of strip photosensitive sub-layers 220 extending in the Z direction and a plurality of photosensitive sub-layer respectively located on the pixels 101. The embodiment is not limited thereto, for example, the plurality of strip photosensitive sub-layers included in the photosensitive layer may respectively correspond to a row of pixels extending in the first direction or the second direction, as long as the drive circuit can determine the position of the light transmission region according to whether the strip photosensitive sub-layer generates the electrical signal or not. Here, "a row of pixels extending in the first direction or the second direction" refers to a pixel row extending in the first direction at a side of the light transmission region along the first direction or a pixel row extending in the second direction at a side of the light transmission region along the second direction.

Figure 7:
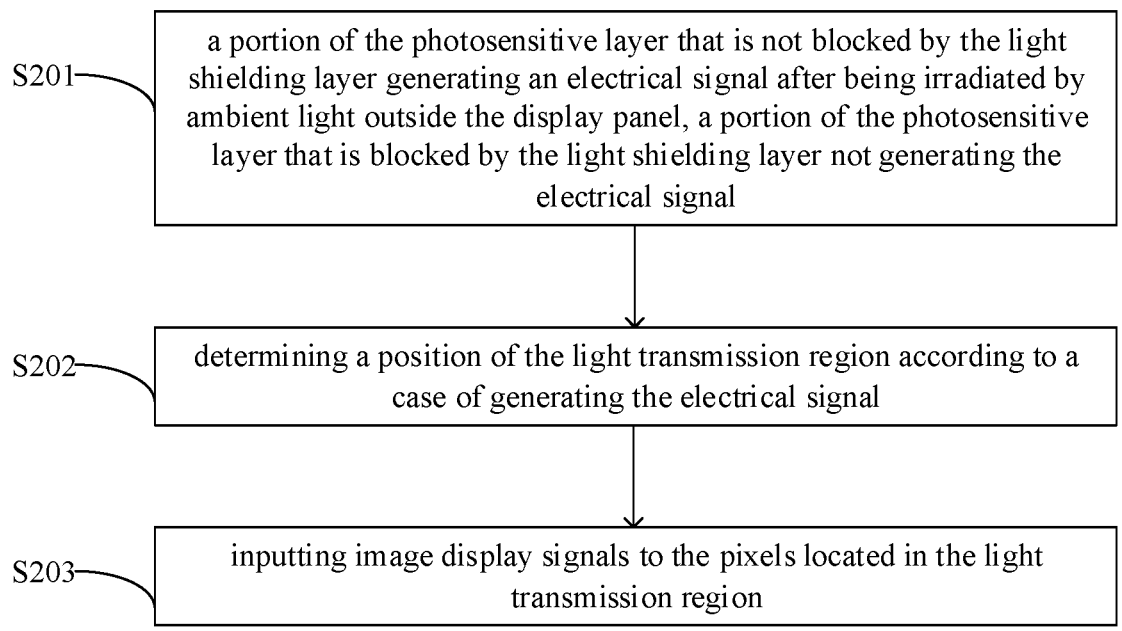
FIG. 7 is a schematic flowchart of a driving method of a display panel according to another embodiment of the present disclosure.

Another embodiment of the present disclosure provides a driving method applied to the above display panel, FIG. 7 is a schematic flowchart of a driving method of a display panel according to another embodiment of the present disclosure. As shown in FIG. 7, the driving method comprises:

S201: a portion of the photosensitive layer that is not blocked by the light shielding layer generating an electrical signal after being irradiated by ambient light outside the display panel, and a portion of the photosensitive layer that is blocked by the light shielding layer not generating the electrical signal.

For example, in a direction perpendicular to the cover plate, the light shielding layer overlaps with at least a portion of the photosensitive layer, and therefore, in a case where a portion of the photosensitive layer is blocked by the light shielding layer of the cover plate, and other portion of the photosensitive layer is exposed by the light transmission region of the cover plate to the ambient light outside the display panel, the photosensitive layer located in the light transmission region generates optical feedback to the ambient light, that is, generates the electrical signal, after being irradiated by the ambient light outside the display panel. However, the photosensitive layer covered by the light shielding layer is not irradiated by light and does not generate optical feedback.

For example, in a case where the photosensitive layer is entirely blocked by the light shielding layer, the photosensitive layer is not irradiated by the ambient light outside the display panel, and thus no electrical signal is generated.

S202: determining a position of the light transmission region according to a case of generating the electrical signal.

For example, the display panel further comprises a drive circuit electrically connected to the photosensitive layer, and the portion of the photosensitive layer that is not blocked by the light shielding layer generates the electrical signal after being irradiated by the ambient light outside the display panel, the drive circuit is configured to determine a position of the photosensitive layer that is irradiated by the ambient light outside the display panel to obtain the position of the light transmission region according to a case where the electrical signal is generated. That is, the portion of the photosensitive layer that is blocked by the light shielding layer is not irradiated by the ambient light outside the display panel, and does not generate the electrical signal. Therefore, the drive circuit can determine the position of the light transmission region based on the position of the photosensitive layer that generates the electrical signal.

The drive circuit in this embodiment provides an external electric field to the photosensitive layer, and simultaneously detects the magnitude of the current in the loop in which the photosensitive layer is located to determine whether the photosensitive layer is irradiated by the ambient light outside the display panel or not. After the photosensitive layer is irradiated by the ambient light outside the display panel, the photosensitive layer generates a photo-generated current, and an ammeter in the loop where the photosensitive layer is located shows that the current has increased. Therefore, the drive circuit can determine the position of the light transmission region according to the electrical signal generated by the photosensitive layer after the photosensitive layer is irradiated by the ambient light outside the display panel.

In a case where the photosensitive layer is disposed only in the second pixel region, is not irradiated by the ambient light outside the display panel, and does not generate the electrical signal, it can be determined that the position of the first pixel region is a region for displaying an image.

The photosensitive layer is disposed in the pixel region in the embodiment of the present disclosure, the photosensitive layer is electrically connected to the drive circuit, and the drive circuit can determine the position of the light transmission region in the cover plate according to the electrical signal generated by the photosensitive layer after the photosensitive layer is irradiated by the ambient light outside the display panel. In addition, in at least one direction of the X direction and the Z direction shown in FIG. 2B, a size of the region where the photosensitive layer is disposed is not less than a general process attaching deviation threshold d (the value range is 100-600 μm). Therefore, the embodiment of the present disclosure can ensure that the light shielding layer does not block the display region for displaying on the display substrate during the process of attaching the cover plate to the display substrate without the attaching deviation of the general attaching process.

S203: inputting image display signals to the pixels located in the light transmission region.

For example, the pixels in the pixel region that are blocked by the light shielding layer are not used for displaying, and the pixels in the pixel region that are not blocked by the light shielding layer are configured to display an image, that is, in the direction perpendicular to the cover plate, the pixels covered by the light transmission region is configured to display an image.

For example, in the direction perpendicular to the cover plate, a region, where a plurality of pixels for displaying are located, in the pixel region completely coincides with the light transmission region, that is, a target display region (the AA region shown in FIG. 2A), which has the same size as a display region (the AA region shown in FIG. 1) in a general display substrate, in the embodiment of the present disclosure completely coincides with the light transmission region of the cover plate. Therefore, with respect to the display panel shown in FIG. 1, the size of the light transmission region included in the cover plate in the display panel provided by the embodiment of the present disclosure no longer comprises a size of the process attaching deviation, and is reduced to the same size as the target display region, so that a size of the black frame located at the periphery of the display region when the display panel is displayed can be effectively reduced, that is, the effect of the narrow frame is achieved.

In some examples, the drive circuit can also comprise data lines connected to the pixels, and the drive circuit is further configured to input the image display signals only to the data lines connected to the pixels located in the light transmission region. Therefore, the drive circuit is further configured to input image display signals only to the data lines connected to the pixels for displaying after determining the position of the light transmission region (that is, the position of the target display region that should be used for displaying). The drive circuit is further configured to input display signals to the pixels located in the first row to N-th row and in the first column to M-th column in the target display region, and no longer to input the display signals for the pixels located at other positions.

As can be seen from the above descriptions, the target display region (that is, the light transmission region of the cover plate) may be located at any position in the pixel region is FIG. 4, as long as the drive circuit determines the position of the light transmission region of the cover plate by the electrical signal of the photosensitive layer after the attaching of the cover plate and the display substrate is completed, the display signals can be input to the pixels located at the position of the light transmission region to achieve the display of the target display region. By this method, the process deviation in the attaching process can be effectively reduced, and the effect of narrow frame can be achieved.

Another embodiment of the present disclosure provides a display device, the display device comprises any one of the display panels in the above embodiment, the display device including the display panel can reduce the deviation in the attaching process, thereby effectively reducing a size of a frame of the display device, achieving the purpose of narrow frame, and further improving the user experience of the product.

For example, the display device may be a liquid crystal display device, an organic light-emitting diode (OLED) display device, and a quantum dot light emitting diode (QLED) display device, or other display devices, and may comprise any product or component having a display function and including the display device such as a television, a digital camera, a mobile phone, a watch, a tablet, a notebook computer, a navigator, and the like, and the embodiment is not limited thereto.

The following statements should be noted:

(1) The same reference numerals denote the same elements/components in the embodiments and the drawings of the present disclosure unless otherwise defined.

(2) In the drawings of the present disclosure, only the structures related to the embodiments of the present disclosure are involved, other structures can be referred to common designs.

(3) For the purpose of clarity only, in accompanying drawings for illustrating the embodiment(s) of the present disclosure, a layer or an area may be enlarged. However, it should understood that, in the case in which a component or element such as a layer, film, area, substrate or the like is referred to be "on" or "under" another component or element, it may be directly on or under the another component or element or a component or element is interposed therebetween.

What are described above is related to the specific embodiments of the present disclosure only and not limitative to the scope of the disclosure, within the disclosed technical scope of the disclosure, the modification and replacement, which any skilled who is familiar with the technical field may easily conceive, should be covered within the scope of the protection of the disclosure. Therefore, the scopes of the disclosure are defined by the accompanying claims.

What is claimed is:

1. A display panel, comprising:
   a pixel region, comprising a first pixel region and a second pixel region located around the first pixel region, the first pixel region and the second pixel region each comprising a plurality of pixels;
   a photosensitive layer, located at least in the second pixel region;
   a cover plate on a side of the plurality of pixels for displaying, and the cover plate comprising a light transmission region and a light shielding layer surrounding the light transmission region,
   wherein the light shielding layer coincides with at least a portion of the second pixel region in a direction perpendicular to the cover plate, and the photosensitive layer is configured to determine a position of the light transmission region, and
   in the direction perpendicular to the cover plate, the light shielding layer overlaps with at least part of the photosensitive layer,
   the photosensitive layer is located only in the second pixel region, and each pixel in the second pixel region is provided with the photosensitive layer.

2. The display panel according to claim 1, wherein the second pixel region is a region surrounding the first pixel region.

3. The display panel according to claim 1, wherein a minimum distance between a side of the second pixel region away from the first pixel region and a side of the second pixel region close to the first pixel region is not less than a process attaching deviation threshold, and a range of a value of the process attaching deviation threshold is 100-600 μm.

4. The display panel according to claim 1, wherein each of the plurality of pixels comprises an effective display region and a peripheral region located around the effective display region, and the photosensitive layer is located in the peripheral region of each of the plurality of pixels.

5. The display panel according to claim 1, wherein the photosensitive layer comprises a transparent material.

6. The display panel according to claim 1, wherein the photosensitive layer comprises a plurality of photosensitive sub-layers, and one of the plurality of photosensitive sub-layers is disposed in one of the plurality of pixels.

7. The display panel according to claim 1, wherein the photosensitive layer comprises a plurality of strip photosensitive sub-layers, and each of the plurality of strip photosensitive sub-layers corresponds to a row of pixels extending along a first direction or a second direction, the first direction intersects the second direction, the light transmission region has a shape of a parallelogram, and the first direction and the second direction are respectively parallel to two adjacent sides of the light transmission region.

8. The display panel according to claim 1, wherein a material of the photosensitive layer comprises a photoelectric conversion material.

9. The display panel according to claim 1, further comprising:
   a drive circuit, electrically connected to the photosensitive layer,
   wherein a portion of the photosensitive layer that is not blocked by the light shielding layer generates an electrical signal after being irradiated by ambient light outside the display panel, a portion of the photosensitive layer that is blocked by the light shielding layer does not generate the electrical signal, and the drive circuit is configured to determine the position of the light transmission region according to a case of generating the electrical signal.

10. The display panel according to claim 9, wherein the drive circuit comprises data lines connected to the plurality of pixels, and the drive circuit is further configured to input image display signals only to the data lines connected to the pixels for displaying.

11. The display panel according to claim 1, wherein, in the direction perpendicular to the cover plate, a region of the pixels for displaying in the pixel region completely coincides with the light transmission region.

12. The display panel according to claim 11, wherein an orthographic projection of the first pixel region on the cover plate completely coincides with the light transmission region.

13. The display panel according to claim 11, wherein, in the direction perpendicular to the cover plate, the light shielding layer overlaps with the pixels in the first pixel region.

14. A driving method for the display panel according to claim 9,
determining the position of the light transmission region according to a case of generating the electrical signal; and
inputting image display signals to the pixels located in the light transmission region.

15. A display panel, comprising:
a pixel region, comprising a first pixel region and a second pixel region located around the first pixel region, the first pixel region and the second pixel region each comprising a plurality of pixels;
a photosensitive layer, located at least in the second pixel region;
a cover plate on a side of the plurality of pixels for displaying, and the cover plate comprising a light transmission region and a light shielding layer surrounding the light transmission region,
wherein the light shielding layer coincides with at least a portion of the second pixel region in a direction perpendicular to the cover plate, and the photosensitive layer is configured to determine a position of the light transmission region, and
in the direction perpendicular to the cover plate, the light shielding layer overlaps with at least part of the photosensitive layer; and
wherein a minimum distance between a side of the second pixel region away from the first pixel region and a side of the second pixel region close to the first pixel region is not less than a process attaching deviation threshold, and a range of a value of the process attaching deviation threshold is 100-600 μm.

16. The display panel according to claim 15, further comprising:
a drive circuit, electrically connected to the photosensitive layer,
wherein a portion of the photosensitive layer that is not blocked by the light shielding layer generates an electrical signal after being irradiated by ambient light outside the display panel, a portion of the photosensitive layer that is blocked by the light shielding layer does not generate the electrical signal, and the drive circuit is configured to determine the position of the light transmission region according to a case of generating the electrical signal.

17. The display panel according to claim 15, wherein the second pixel region is a region surrounding the first pixel region.

18. The display panel according to claim 15, wherein, in the direction perpendicular to the cover plate, a region of the pixels for displaying in the pixel region completely coincides with the light transmission region.

19. The display panel according to claim 15, wherein each of the plurality of pixels comprises an effective display region and a peripheral region located around the effective display region, and the photosensitive layer is located in the peripheral region of each of the plurality of pixels.

* * * * *